(12) United States Patent
Kuo

(10) Patent No.: US 6,545,309 B1
(45) Date of Patent: Apr. 8, 2003

(54) NITRIDE READ-ONLY MEMORY WITH PROTECTIVE DIODE AND OPERATING METHOD THEREOF

(75) Inventor: Tung-Cheng Kuo, Yilan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/104,397

(22) Filed: Mar. 22, 2002

(30) Foreign Application Priority Data

Mar. 11, 2002 (TW) ........................................ 91104456 A

(51) Int. Cl.[7] ...................... H01L 27/108; H01L 31/119
(52) U.S. Cl. ........................................ 257/302; 257/316
(58) Field of Search ............................... 257/302, 316, 257/399

(56) References Cited

U.S. PATENT DOCUMENTS 6,030,871 A * 2/2000 Eitan 6,486,028 B1 * 11/2002 Chang et al.

FOREIGN PATENT DOCUMENTS

EP          1225596          * 7/2002

* cited by examiner

Primary Examiner—Stephen D. Meier
(74) Attorney, Agent, or Firm—J.C. Patents

(57) ABSTRACT

A NROM with a protective diode is described. The NROM comprises a substrate, a NROM cell, an $n^+$-doped region, an $n^+$-doped guard ring and a polysilicon guard ring, wherein the substrate, the $n^+$-doped region, the $n^+$-doped guard ring and the polysilicon guard ring constitute a protective diode. The NROM cell is disposed on the substrate. The $n^+$-doped region is located in the substrate and is electrically connected with a word-line of the NROM cell. The $n^+$ guard ring is located in the substrate surrounding the $n^+$-doped region. The polysilicon guard ring is disposed on the substrate between the $n^+$-doped region and the $n^+$-doped guard ring.

11 Claims, 4 Drawing Sheets

NITRIDE READ-ONLY MEMORY WITH PROTECTIVE DIODE AND OPERATING METHOD THEREOF

CROSS-REFERENCE TO RELATED APPLICATION

This application claims the priority benefit of Taiwan application serial no. 91104456, filed Mar. 11, 2002.

BACKGROUND OF THE INVENTION

1. Field of Invention

The present invention relates to a structure of a non-volatile memory (NVM) device and an operating method of the NVM device. More particularly, the present invention relates to a structure of a nitride read-only memory (NROM) with a protective diode and an operating method of the NROM.

2. Description of Related Art

The non-volatile memory family includes the electrically erasable programmable read-only memory ($E^2$PROM). An $E^2$PROM can be programmed, read, and erased repeatedly and can retain data even if the power is switched off, and therefore is widely used in personal computers and in electronic apparatuses.

A conventional $E^2$PROM uses a floating gate and a control gate both made from doped polysilicon. When the $E^2$PROM is being programmed, the control gate and the source/drain of a selected memory cell are applied with appropriate biases. An electron flow from the source to the drain is thereby induced in the channel. The electron flow can produce hot electrons that will tunnel through the tunnel oxide layer and into the floating gate and will distribute evenly in the floating gate. An $E^2$PROM is usually programmed by the above-mentioned "Channel Hot-Electron Injection (CHEI)" mechanism and is usually erased by the Fowler-Nordheim tunneling mechanism. The disadvantage of the conventional $E^2$PROM is that a leakage easily occurs in the memory cell if there are defects in the tunnel oxide layer, and the reliability of the device is thus lowered.

To solve the leakage problem of the conventional $E^2$PROM, a charge-trapping layer is recently developed to replace the polysilicon floating gate in the conventional $E^2$PROM. The charge-trapping layer usually comprises a silicon nitride layer that is disposed between two silicon oxide layers to form an oxide/nitride/oxide (ONO) composite layer, while the memory with a nitride charge-trapping layer is known as a "nitride read-only memory (NROM)". In a NROM, the nitride charge-trapping is able to trap electrons so that the injected hot electrons will not distribute evenly in the charge-trapping layer, but will be localized in a region of the charge-trapping layer near the drain with a Gaussian spatial distribution. Because the injected electrons are localized, the charge-trapping region is small and is less likely to locate on the defects of the tunnel oxide layer. A leakage therefore does not easily occur in the device.

In a manufacturing process of NROM, plasma techniques are frequently used as in the other semiconductor processes. However, when a transient charge unbalance occurs in the plasma, some charges will move along the metal portions on the wafer. Such an effect is called the antenna effect. Consequently, some charges are injected into the charge trapping layers of the non-volatile memory to unevenly raise the threshold voltages ($V_T$) of the memory cells, i.e., to produce a programming effect. Therefore, the $V_T$ distribution of the non-volatile memory is much broadened, being usually from 0.3V to 0.9V.

In order to prevent the programming effect caused by the antenna effect, a diode is formed in the substrate to electrically connect with a word-line of a NROM in the prior art. When the charges accumulated on the word-line reach a certain amount to produce a voltage higher than the breakdown voltage of the diode, the charges are released by the diode in a breakdown manner. However, when the NROM is being programmed or read, the input voltage applied on a word-line of the NROM will be lowered by the diode since the voltage required for programming or reading the NROM may be higher than the breakdown voltage of the diode. The operating speed of the NROM device is therefore decreased.

SUMMARY OF THE INVENTION

Accordingly, this invention provides a NROM that has a protective diode having an adjustable breakdown voltage and an operating method of the NROM to prevent the charge trapping layer from being damaged or being programmed as well as to avoid the input voltage of the NROM from being lowered.

The NROM with a protective diode of this invention comprises a substrate, a NROM cell, an $n^+$-doped region, an $n^+$ guard ring and a polysilicon guard ring, wherein the substrate, the $n^+$-doped region, the $n^+$ guard ring and the polysilicon guard ring constitute a protective diode. The NROM cell is disposed on the substrate. The $n^+$-doped region is located in the substrate and is electrically connected with a word-line of the NROM cell. The $n^+$ guard ring is located in the substrate surrounding the $n^+$-doped region. The polysilicon guard ring is disposed on the substrate between the $n^+$-doped region and the $n^+$ guard ring.

This invention also provides an operating method of the above-mentioned NROM of this invention. When the NROM is being programmed, the word-line of the NROM is applied with a first positive bias, the polysilicon guard ring is applied with a second positive bias, and the $n^+$ guard ring is floated. When the NROM is being read, the word-line is applied with a third positive bias, the polysilicon guard ring is applied with a fourth positive bias, and the $n^+$ guard ring is floated. When the NROM is being erased, a fifth positive bias is applied to an N-well under the NROM cell.

In this invention, a protective diode electrically connecting with a word-line of the NROM cell is used to conduct the charges on the word-line into the substrate in a back-end plasma process. The breakdown voltage of the protective diode is, for example, 3V~5V so that the charges are easily conducted into the substrate. Therefore, the charge trapping layer of the NROM will not be damaged or be programmed in the plasma process.

Moreover, since the $n^+$-doped region is surrounded by the $n^+$ guard ring and a positive bias is applied to the polysilicon guard ring in the programming or reading method of a NROM of this invention, the junction profile of the diode is expanded and the junction corner is rounded. Consequently, when the NROM is being programmed or being read, the breakdown voltage of the protective diode is raised and the input voltage is thus not lowered by the diode.

In addition, to further decrease the leakage caused by the diode, more than one $n^+$ guard rings can be formed in the substrate surrounding the $n^+$-doped region to further round the junction corner of the protective diode and thereby raise the breakdown voltage of the protective diode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
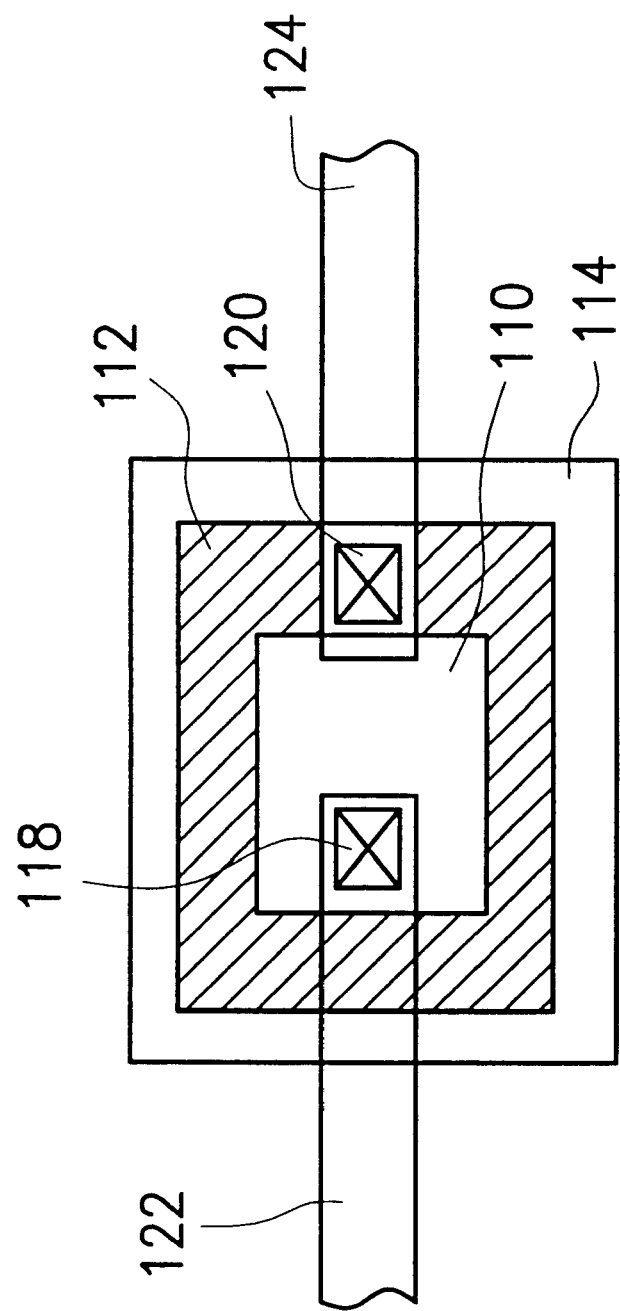
FIG. 1 illustrates a top view of a protective diode with an adjustable breakdown voltage according to a preferred embodiment of this invention.
Figure 2:
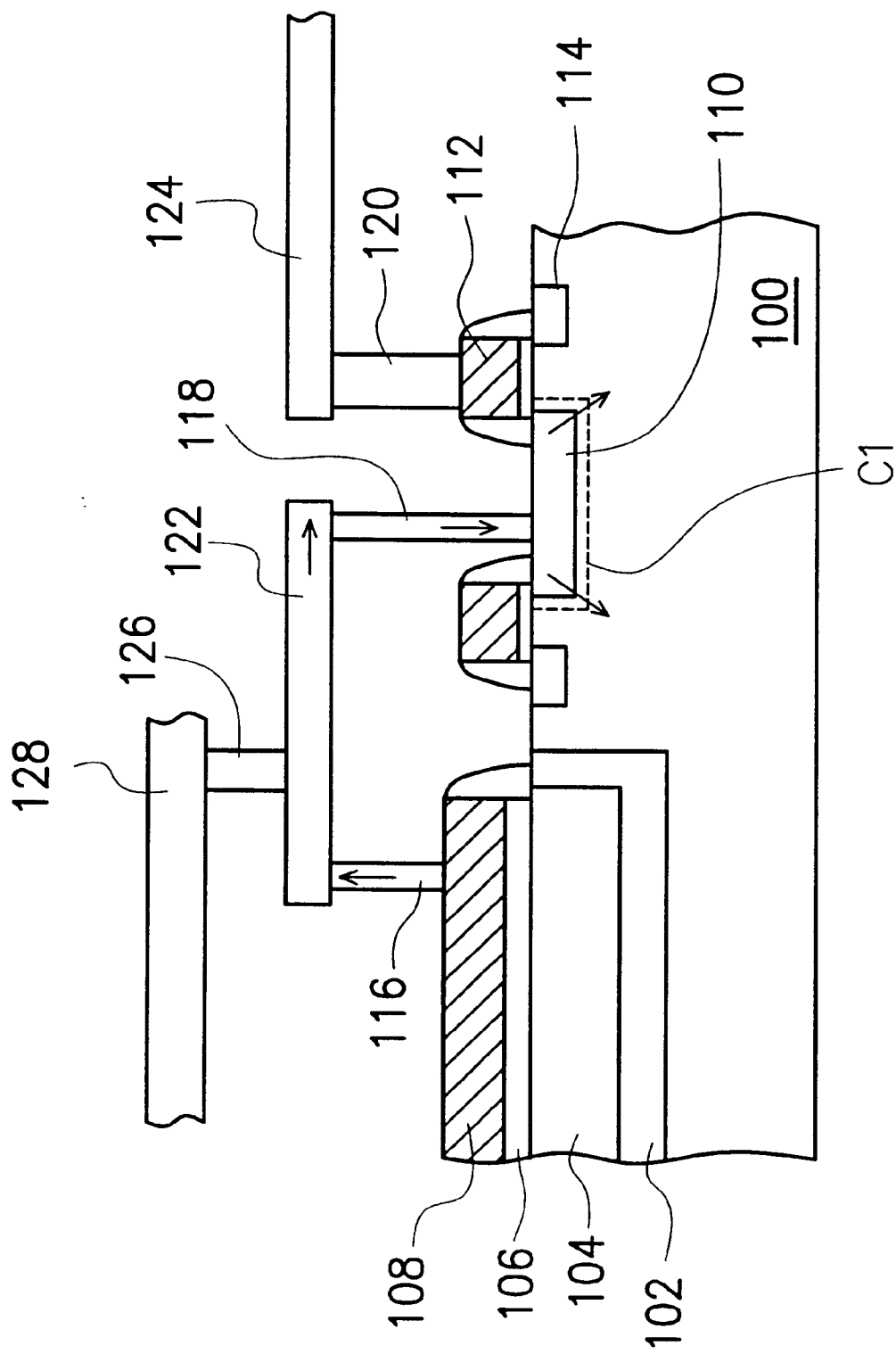
FIG. 2 illustrates a cross-sectional view of a NROM structure having a protective diode with an adjustable breakdown voltage according to the preferred embodiment of this invention.

Refer to FIG. 1 and FIG. 2, wherein FIG. 1 illustrates a top view of a protective diode with an adjustable breakdown voltage and FIG. 2 illustrates a cross-sectional view of a NROM structure having the protective diode according to a preferred embodiment of this invention.

As that shown in FIG. 1 and FIG. 2, the NROM structure comprises a substrate 100, an N-well 102, a P-well 104, a charge-trapping layer 106, a gate conductive layer (word-line) 108, an $n^+$-doped region 110, a polysilicon guard ring 112, an $n^+$ guard ring 114, three plugs 116, 118 and 120, two conductive lines 122 and 124, a via 126, and a conductive line 128.

The substrate 100 is, for example, a P-type substrate. The gate conductive layer (word-line) 108 is disposed on the substrate 100 and comprises, for example, a polysilicon layer and a metal silicide layer thereon. The charge-trapping layer 106 is located between the gate conductive layer 108 and the substrate 100 and preferably comprises a silicon oxide/silicon nitride/silicon oxide (ONO) layer. The N-well 102 is located in the substrate 100 under the gate conductive layer 108. The P-well 104 is located between the N-well 102 and the gate conductive layer 108. The $n^+$-doped region 110 is located in the substrate 100 and the $n^+$ guard ring 114 is located in the substrate 100 surrounding the $n^+$-doped region 110. The polysilicon guard ring 112 is disposed on the substrate 100 between the $n^+$-doped region 110 and $n^+$ guard ring 114. The conductive line 122 is disposed over the substrate 100 with one end electrically connected to the gate conductive layer (word-line) 108 via a plug 116 and the other end electrically connected to the $n^+$-doped region 110 via a plug 118. The conductive line 128 is disposed over the substrate 100 and the conductive line 122 and is electrically connected with the conductive line 122 through the via 126. The conductive line 124 is disposed over the substrate 100 and is electrically connected with the polysilicon guard ring 112 via the plug 120.

The functions and the operating method of the protective diode with an adjustable breakdown voltage according to the preferred embodiment of this invention are described hereinafter.

Refer to FIG. 2, during a back-end plasma process of a non-volatile memory, the charges on the gate conductive layer (word-line) 108 can be conducted to the $n^+$-doped region 110 (diode) via the plug 116, the conductive line 122 and the plug 118, as shown by the arrows. When the charges on the gate conductive layer 108 reach a certain amount to cause a voltage higher than the breakdown voltage (e.g., 3V~5V) of the protective diode, the charges are released from the junction corner of the junction profile C1 into the substrate 100 in a breakdown manner. Therefore, the charge-trapping layer 106 of the NROM will not be damaged or be programmed.

Figure 3:
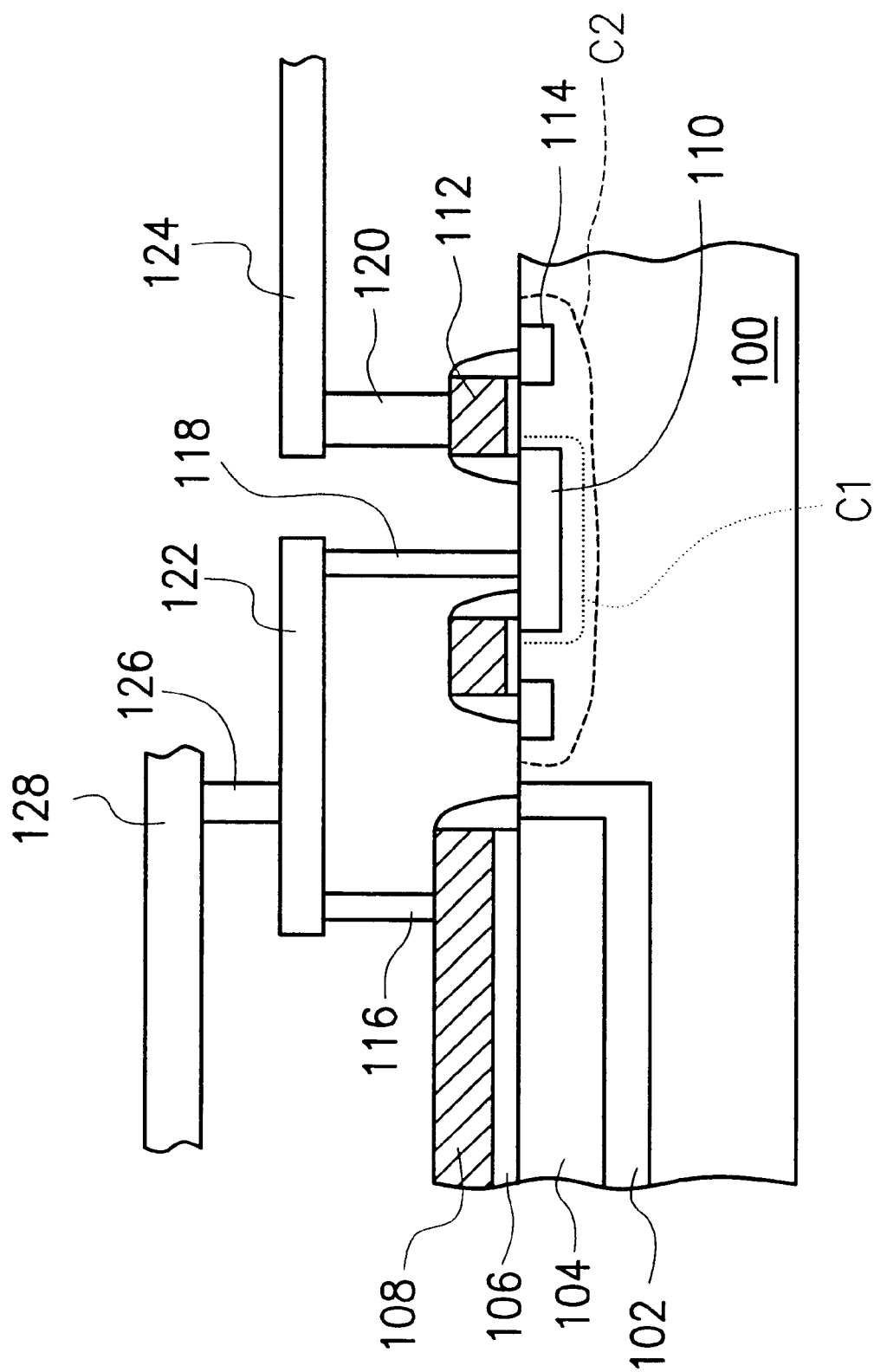
FIG. 3 schematically illustrates the change of the junction profile of the protective diode when the NROM is being programmed or being read according to the preferred embodiment of this invention.

Refer to FIG. 3, the NROM is usually programmed by the channel hot electron injection (CHEI) method, wherein a positive bias, such as a bias from 6V to 9V, is applied to the gate conductive layer (word-line) 108. Therefore, the breakdown voltage of the protective diode needs to be adjusted to one higher than the positive bias, such as 7V~10V, in order to prevent a leakage caused by the diode and thereby to maintain the programming speed of the NROM. Accordingly, the polysilicon guard ring 112 is applied with another positive bias, such as a bias from 8V to 11V, via the conductive line 124 and the plug 120 and the $n^+$ guard ring 114 is floated. Consequently, the junction profile of the protective diode changes from C1 to C2 and the junction corner is rounded, so that the breakdown voltage of the protective diode increases to the desired one.

On the other hand, when the NROM is being read, a smaller positive bias, such as a bias from 2V to 4V, is applied to the gate conductive layer (word-line) 108. Similarly, the polysilicon guard ring 112 needs to be applied with another positive bias to increase the breakdown voltage of the protective diode and thereby maintain the reading speed of the NROM. The positive bias applied to the polysilicon guard ring 112 is, for example, 8V~11V to raise the breakdown voltage of the protective diode to 7V~10V.

Figure 4:
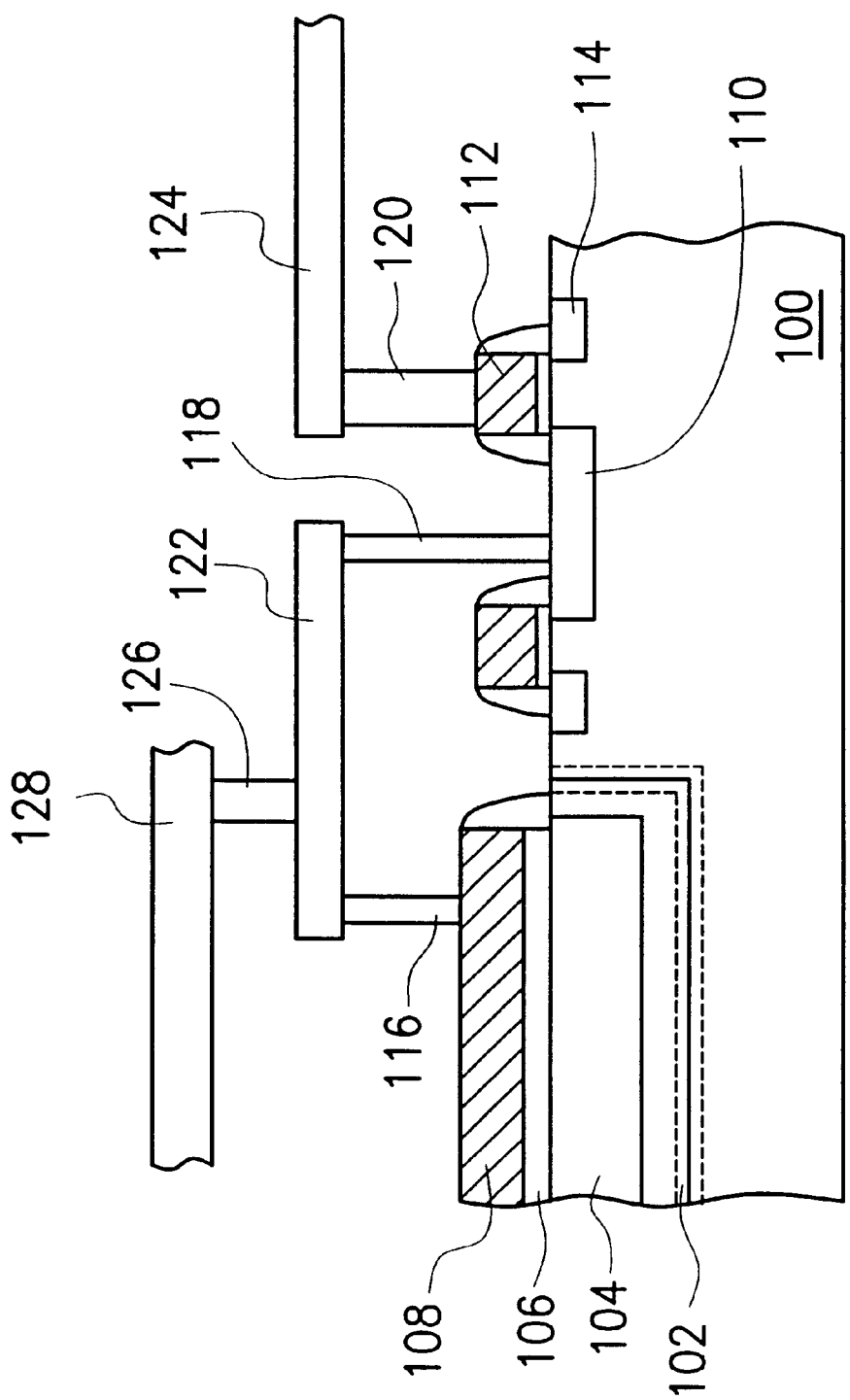
FIG. 4 schematically illustrates the change of the NROM cell when the NROM is being erased according to the preferred embodiment of this invention.

Refer to FIG. 4, which schematically illustrates the change of the NROM cell when the NROM is being erased according to the preferred embodiment of this invention. The NROM is usually erased by band-to-band hot hole erasing from the bit-line, wherein the N-well 102 is applied with a positive bias, such as 5V, to create a upward electric field between the gate conductive layer 108 and the P-well 104. Since the gate conductive layer (word-line) 108 is not applied with a positive bias, no bias needs to be applied to the polysilicon guard ring 112.

In this invention, a protective diode electrically connecting with the word-line of a NROM cell is used to conduct the charges on the word-line into the substrate in a back-end plasma process. The breakdown voltage of the protective diode is, for example, 3V~5V so that the charges are easily conducted into the substrate 100. Therefore, the charge-trapping layer 106 of the NROM will not be damaged or be programmed.

Moreover, since the $n^+$-doped region is surrounded by the $n^+$ guard ring and a positive bias is applied to the polysilicon guard ring in the programming or reading method of a NROM of this invention, the junction profile of the diode is expanded and the junction corner is rounded. Consequently, when the NROM is being programmed or being read, the breakdown voltage of the protective diode is raised and the input voltage is thus not lowered by the diode.

In addition, to further decrease the leakage caused by the protective diode, more than one $n^+$ guard rings can be formed in the substrate surrounding the $n^+$-doped region to further round the junction corner of the protective diode and thereby raise the breakdown voltage of the protective diode.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A nitride read-only memory (NROM) with a protective diode, comprising
   a substrate;
   a NROM cell on the substrate;
   an $n^+$-doped region in the substrate electrically connecting with a word-line of the NROM cell;
   a first $n^+$ guard ring in the substrate surrounding the $n^+$-doped region; and
   a polysilicon guard ring on the substrate between the first $n^+$ guard ring and the $n^+$-doped region.

2. The nitride read-only memory of claim 1, wherein the NROM cell includes a silicon oxide/silicon nitride/silicon oxide (ONO) layer.

3. The nitride read-only memory of claim 1, further comprising at least a second $n^+$ guard ring in the substrate surrounding the first $n^+$ guard ring.

4. An method for operating a nitride read-only memory (NROM) with a protective diode, wherein the protective diode comprises an $n^+$-doped region in a substrate electrically connecting with a word-line of a NROM cell, an $n^+$ guard ring in the substrate surrounding the $n^+$-doped region and a polysilicon guard ring on the substrate between the $n^+$ guard ring and the $n^+$-doped region, the method comprising:
   applying a first positive bias to the word-line and a second bias to the polysilicon guard ring and setting the $n^+$ guard ring floated when the NROM is being programmed.

5. The method of claim 4, wherein the first positive bias ranges from about 6V to about 9V.

6. The method of claim 4, wherein the second positive bias ranges from about 8V to about 11V.

7. An method for operating a nitride read-only memory (NROM) with a protective diode, wherein the protective diode comprises an $n^+$-doped region in a substrate electrically connecting with a word-line of a NROM cell, an $n^+$ guard ring in the substrate surrounding the $n^+$-doped region and a polysilicon guard ring on the substrate between the $n^+$ guard ring and the $n^+$-doped region, the method comprising:
   applying a first positive bias to the word-line and a second bias to the polysilicon guard ring and setting the $n^+$ guard ring floated when the NROM is being read.

8. The method of claim 7, wherein the first positive bias ranges from about 2V to about 4V.

9. The method of claim 7, wherein the second positive bias ranges from about 8V to about 11V.

10. An method for operating a nitride read-only memory (NROM) with a protective diode, wherein the protective diode comprises an $n^+$-doped region in a substrate electrically connecting with a word-line of a NROM cell, an $n^+$ guard ring in the substrate surrounding the $n^+$-doped region and a polysilicon guard ring on the substrate between the $n^+$ guard ring and the $n^+$-doped region, and the NROM cell includes a P-well and an N-well under the P-well, the method comprising:
    applying a positive bias to the N-well when the NROM is being erased.

11. The method of claim 10, wherein the positive bias is about 5V.

* * * * *